(12) United States Patent
Huang et al.

(10) Patent No.: US 11,204,558 B2
(45) Date of Patent: Dec. 21, 2021

(54) PARTICLE SUPPRESSION SYSTEMS AND METHODS

(71) Applicants: ASML NETHERLANDS B.V., Veldhoven (NL); ASML HOLDING N.V., Veldhoven (NL)

(72) Inventors: Yang-Shan Huang, Veldhoven (NL); Daniel Nathan Burbank, Ridgefield, CT (US); Marco Koert Stavenga, Eindhoven (NL)

(73) Assignees: ASML Netherlands B.V., Veldhoven (NL); ASML Holding N.V., Veldhoven (NL)

( * ) Notice: Subject to any disclaimer, the term of this patent is extended or adjusted under 35 U.S.C. 154(b) by 56 days.

(21) Appl. No.: 16/629,349

(22) PCT Filed: Jul. 18, 2018

(86) PCT No.: PCT/EP2018/069459
§ 371 (c)(1),
(2) Date: Jan. 8, 2020

(87) PCT Pub. No.: WO2019/020443
PCT Pub. Date: Jan. 31, 2019

(65) Prior Publication Data
US 2020/0142326 A1 May 7, 2020

Related U.S. Application Data

(60) Provisional application No. 62/538,210, filed on Jul. 28, 2017.

(51) Int. Cl.
*G03F 7/20* (2006.01)
(52) U.S. Cl.
CPC .......... *G03F 7/70916* (2013.01); *G03F 7/707* (2013.01); *G03F 7/70716* (2013.01); *G03F 7/70866* (2013.01)

(58) Field of Classification Search
CPC ............ G03F 7/70141; G03F 7/70258; G03F 7/70691; G03F 7/70725; G03F 7/70775;
(Continued)

(56) References Cited

U.S. PATENT DOCUMENTS 6,445,440 B1 9/2002 Bisschops et al.
6,731,371 B1 * 5/2004 Shiraishi ................ G03B 27/52
250/492.2
(Continued)

FOREIGN PATENT DOCUMENTS

JP 2007189073 7/2007
WO 2019020450 1/2019

OTHER PUBLICATIONS

International Search Report and Written Opinion issued in corresponding PCT Patent Application No. PCT/EP2018/069459, dated Nov. 7, 2018.
(Continued)

*Primary Examiner* — Christina A Riddle
(74) *Attorney, Agent, or Firm* — Pillsbury Winthrop Shaw Pittman LLP

(57) ABSTRACT

An object stage that includes a first structure and a second structure movable relative to the first structure. The second structure is configured to support an object. The object stage also includes a seal plate movably coupled to the first structure or the second structure, but not both. Further, the object stage includes an actuator configured to move the seal plate such that a substantially constant gap is defined between the seal plate and the first structure or second structure that is not coupled to the seal plate.

21 Claims, 12 Drawing Sheets

(58) Field of Classification Search
CPC .. G03F 7/708; G03F 7/70808; G03F 7/70816; G03F 7/70825; G03F 7/70833; G03F 7/7085; G03F 7/70858; G03F 7/70883; G03F 7/70908; G03F 7/70975; G03F 7/70916; G03F 7/70716; G03F 7/707; G03F 7/70933; G03F 7/70866; G03F 7/20; F16C 29/025; F16C 32/0603
USPC .......................................... 355/30, 53, 67–77
See application file for complete search history.

(56) References Cited

U.S. PATENT DOCUMENTS

| | | |
|---|---|---|
| 2005/0206860 A1 | 9/2005 | Hof et al. |
| 2005/0275835 A1 | 12/2005 | Sogard |
| 2007/0209226 A1 | 9/2007 | Coon |
| 2007/0285632 A1 | 12/2007 | Phillips et al. |
| 2009/0059190 A1 | 3/2009 | Tanaka et al. |
| 2012/0249983 A1 | 10/2012 | Vogel et al. |
| 2013/0021594 A1* | 1/2013 | Umemura ............... G03F 7/707 355/75 |
| 2014/0085618 A1 | 3/2014 | Delgado et al. |

OTHER PUBLICATIONS

International Search Report and Written Opinion issued in corresponding PCT Patent Application No. PCT/EP2018/069476, dated Nov. 15, 2018.

\* cited by examiner

PARTICLE SUPPRESSION SYSTEMS AND METHODS

CROSS-REFERENCE TO RELATED APPLICATIONS

This application is the U.S. national phase entry of PCT Patent Application No. PCT/EP2018/069459, which was filed on Jul. 18, 2018, which claims the benefit of priority of U.S. Provisional Patent Application No. 62/538,210, which was filed on Jul. 28, 2017, and which is incorporated herein in its entirety by reference.

FIELD

The present disclosure relates to particle suppression in, for example, lithography.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print the pattern, $k_1$ is a process-dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture NA or by decreasing the value of $k_1$.

In order to shorten the exposure wavelength and, thus, reduce the minimum printable size, it has been proposed to use an extreme ultraviolet (EUV) radiation source. EUV radiation is electromagnetic radiation having a wavelength within the range of 5-20 nm, for example within the range of 13-14 nm. It has further been proposed that EUV radiation with a wavelength of less than 10 nm could be used, for example within the range of 5-10 nm such as 6.7 nm or 6.8 nm. Such radiation is termed extreme ultraviolet radiation or soft x-ray radiation. Possible sources include, for example, laser-produced plasma sources, discharge plasma sources, or sources based on synchrotron radiation provided by an electron storage ring.

A lithographic apparatus includes a patterning device (e.g., a mask or a reticle). Radiation is provided through or reflected off the patterning device to form an image on a substrate. The patterning device can be held in a vacuum environment. Within this vacuum environment, there can be contaminant particle sources, for example, cables or cable and hose carriers, which can generate contaminant particles. If these contaminant particles reach the patterning device and/or regions near the patterning device, defects in the formed image may occur.

SUMMARY OF THE DISCLOSURE

In some embodiments, an object stage for a lithographic apparatus includes a movable seal plate for reducing or eliminating contaminant particles that can reach a supported object.

In some embodiments, an object stage includes a first structure and a second structure movable relative to the first structure. The second structure is configured to support an object. The object stage also includes a seal plate movably coupled to the first structure or the second structure, but not both. And the object stage includes at least one actuator configured to move the seal plate such that a substantially constant gap is defined between the seal plate and the first structure or the second structure that is not coupled to the seal plate.

In some embodiments, a lithographic apparatus configured to transfer a pattern from a patterning device onto a substrate includes a substrate table configured to hold and move the substrate along a scanning direction. The lithographic apparatus also includes a reticle stage configured to hold and move the reticle along the scanning direction. The reticle stage includes a first structure and a chuck movable relative to the first structure. The chuck is configured to support the reticle. The reticle stage includes a seal plate movably coupled to the first structure or the chuck, but not both. The reticle stage also includes at least one actuator configured to move the seal plate such that a substantially constant gap is defined between the seal plate and the first structure or the chuck that is not coupled to the seal plate.

BRIEF DESCRIPTION OF THE DRAWINGS

The accompanying drawings, which are incorporated herein and form part of the specification, illustrate the present disclosure and, together with the description, further serve to explain the principles of the disclosure and to enable a person skilled in the relevant art(s) to make and use the invention.

Figure 1A:
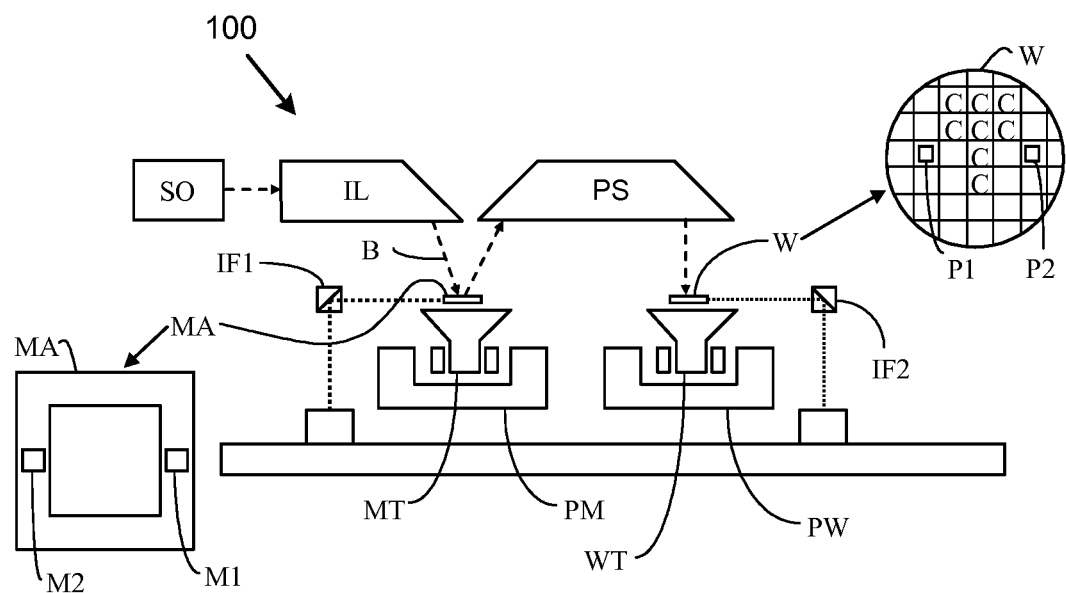
FIG. 1A is a schematic illustration of a reflective lithographic apparatus according to an embodiment.

The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. Unless otherwise indicated, the drawings provided throughout the disclosure should not be interpreted as to-scale drawings.

DETAILED DESCRIPTION

This specification discloses one or more embodiments that incorporate the features of this disclosure. The disclosed embodiment(s) merely exemplify the disclosure. The scope of the disclosure is not limited to the disclosed embodiment(s). The disclosure is defined by the claims appended hereto.

The embodiment(s) described, and references in the specification to "one embodiment," "an embodiment," "an example embodiment," "embodiments," "exemplary," "example," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing such embodiments in more detail, however, it is instructive to present an example environment in which embodiments of the present disclosure may be implemented.

Exemplary Reflective and Transmissive Lithographic Systems

Figure 1B:
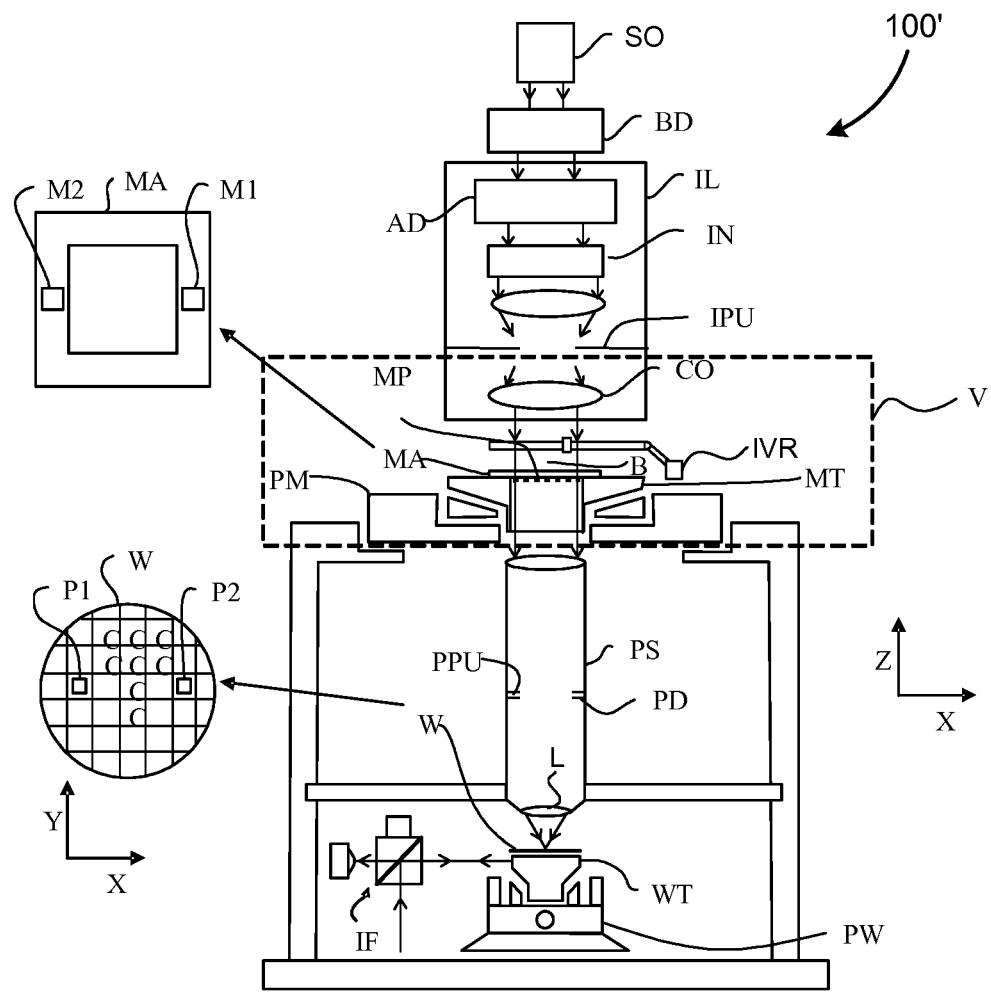
FIG. 1B is a schematic illustration of a transmissive lithographic apparatus according to an embodiment.

FIGS. 1A and 1B are schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a reticle stage or a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100'— for example when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, a reticle stage or mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, a reticle stage or mask table MT), and is patterned by the patterning device. Having traversed the mask MA, the radiation beam B passes through the projection system PS, which focuses the beam onto a target portion C of the substrate W. The projection system has a pupil PPU conjugate to an illumination system pupil IPU. Portions of radiation emanate from the intensity distribution at the illumination system pupil IPU and traverse a mask pattern without being affected by diffraction at a mask pattern and create an image of the intensity distribution at the illumination system pupil IPU.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the reticle stage or mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the reticle stage or mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Reticle stage or mask table MT and patterning device MA can be in a vacuum chamber, where an in-vacuum robot IVR can be used to move patterning devices such as a mask or a reticle in and out of vacuum chamber. Alternatively, when reticle stage or mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, reticle stage or mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, reticle stage or mask table) MT and the substrate table WT are scanned synchronously while a pattern imparted to the radiation beam B is projected onto a target portion C (i.e., a single dynamic exposure). The velocity and direction of the substrate table WT relative to the support structure (for example, reticle stage or mask table) MT can be determined by the (de-)magnification and image reversal characteristics of the projection system PS.

3. In another mode, the support structure (for example, reticle stage or mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
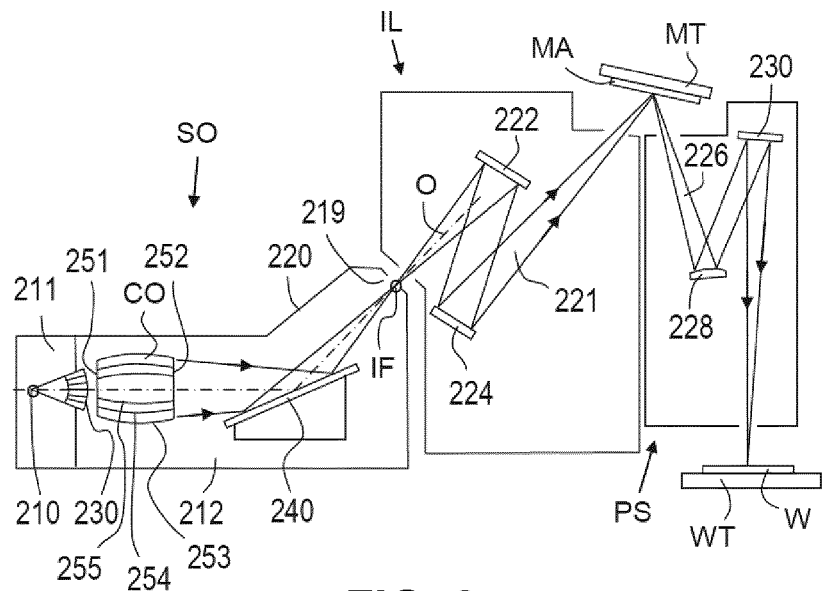
FIG. 2 is a more detailed schematic illustration of the reflective lithographic apparatus, according to an embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor or Sn vapor in which the very hot plasma 210 is created to emit radiation in the EUV range of the electromagnetic spectrum. The very hot plasma 210 is created by, for example, an electrical discharge causing an at least partially ionized plasma. Partial pressures of, for example, 10 Pa of Xe, Li, Sn vapor or any other suitable gas or vapor may be required for efficient generation of the radiation. In an embodiment, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a facetted field mirror device 222 and a facetted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 230 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIGs., for example there may be 1-6 additional reflective elements present in the projection system PS than shown in FIG. 2.

Collector optic CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector optic CO of this type is preferably used in combination with a discharge produced plasma source, often called a DPP source.

Exemplary Lithographic Cells

Figure 3:
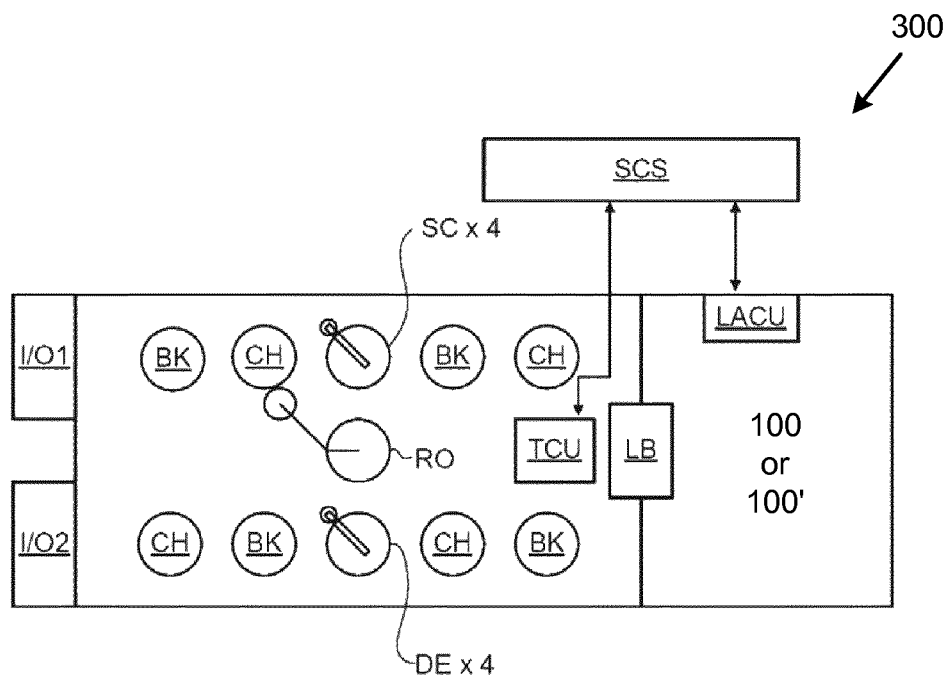
FIG. 3 is a schematic illustration of a lithographic cell, according to an embodiment.

FIG. 3 shows a lithographic cell 300, also sometimes referred to a lithocell or cluster. Lithographic apparatus 100 or 100' may form part of lithographic cell 300. Lithographic cell 300 may also include apparatus to perform pre- and post-exposure processes on a substrate. Conventionally these include spin coaters SC to deposit resist layers, developers DE to develop exposed resist, chill plates CH and bake plates BK. A substrate handler, or robot, RO picks up substrates from input/output ports I/O1, I/O2, moves them between the different process apparatus and delivers then to the loading bay LB of the lithographic apparatus. These devices, which are often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

Exemplary Object Stages

The embodiments of this disclosure can be used with one or more apparatuses of FIGS. 1A, 1B, 2, and/or 3. For example, the embodiments of this disclosure can be applied to object stages, such as (a) reticle stage or mask table MT or (b) substrate table WT, that are configured to support an object, such as substrate W and patterning device MA.

Figure 4:
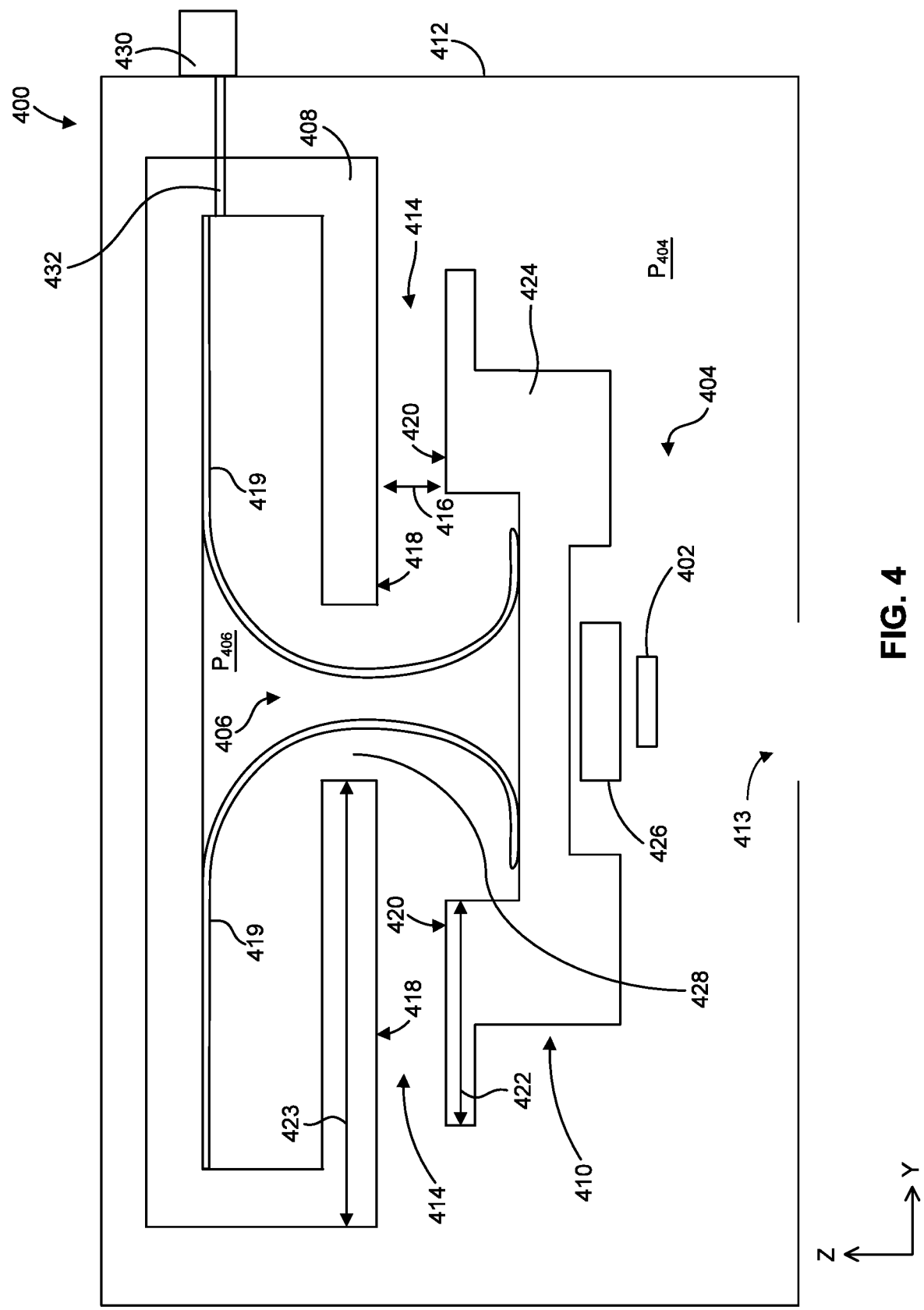
FIG. 4 schematically depicts a cross-section of an object stage, according to an embodiment.

FIG. 4 schematically depicts, in cross-section, one embodiment of an object stage 400. In some embodiments, object stage 400 can be a reticle stage configured to support and move a patterning device 402. Although some of the below embodiments are discussed with respect to a reticle stage, the embodiments can be applied to other suitable components (e.g., substrate table WT, wafer stage, wafer handler, reticle handler, or other components sensitive to particle contamination) of a lithography apparatus (e.g., lithography apparatuses 100 and 100' as described in this disclosure), or other particle sensitive apparatus such as metrology systems, tubes, gas flow ducts, or boxes of gas ducts/pipes. The embodiments of this disclosure can also be applied to any particle sensitive apparatus to reduce the number of undesired contaminant particles.

Reticle stage 400 can be configured to eliminate or reduce the amount of contamination particles reaching patterning device 402 and/or regions near patterning device 402 in a first chamber 404 from a second chamber 406.

For example, as depicted in FIG. 4, reticle stage 400 can include a first structure 408 and a second structure 410 that are movable relative to each other. In some embodiments, first structure 408 is stationary, and second structure 410 is movable. In some embodiments, first structure 408 is movable, and second structure 410 is stationary. And in some embodiments, both first and second structures 408 and 410 are movable or stationary as needed.

First and second structures 408 and 410 can be positioned within a housing 412. In some embodiments, first structure 408 is separate from housing 412 as shown in FIG. 4. In some embodiments (not shown), first structure 408 is part of housing 412. Housing 412 can define a volume held at a vacuum pressure—a pressure below the atmospheric pressure. In some embodiments, housing 401 includes an opening 413 configured to allow radiation to pass from an illumination system (e.g., illumination system IL as shown in FIGS. 1A and 1B) to patterning device 412 and back to a projection system (e.g., projection system PS as shown in FIGS. 1A and 1B). Within housing 412, one or more of first structure 408 and second structure 410 can at least partially define at least first chamber 404 and second chamber 406. In some embodiments, housing 401 can include more than two vacuum chambers. In some embodiments, first structure 408 and second structure 410 are movably coupled relative to each other (e.g., using magnetic levitation) such that a gap 414 is formed between first structure 408 and second structure 410. In some embodiments, gap 414 extends between first chamber 404 and second chamber 406. In some embodiments, the boundary between first chamber 404 and second chamber 406 is defined by gap 414.

According to some embodiments, each of first chamber 404 and second chamber 406 can be held at a vacuum pressure—a pressure below the atmospheric pressure. For example, the vacuum pressure can range from about 0.1 Pa to about 8.5 Pa. In some examples, the vacuum pressure can range from about 0.5 Pa to about 8.5 Pa. For example, the vacuum pressure can range from about 1.5 Pa to about 8.5 Pa. In some examples, the vacuum pressure can range from about 2 Pa to about 5 Pa. In some examples, the vacuum pressure can range from about 2 Pa to about 3 Pa. In some embodiments, the pressure P404 in first chamber 404 can be similar to or different from the pressure P406 in second chamber 406. For example, the pressure P404 in first chamber 404 can be more than the pressure P406 in second chamber 406. For example, the pressure P406 in second chamber 406 can range from about 0.25 Pa to about 1 Pa, and the pressure P404 in first chamber 404 can range from about 2 Pa to about 3 Pa.

In some embodiments, second chamber 406, first structure 408, and second structure 410 may include or house components that are sources of contaminant particle sources. For example, cable and hose carriers 419 (sometimes referred to as cable slabs) are positioned within second chamber 406. Cable and hose carriers 419 can be configured in a rolling loop configuration, and cable and hose carriers 419 can house electrical wires and/or fluid hoses (e.g., liquid and gas hoses) that electrically and/or fluidly couple second structure 410 to first structure 408. Cable and hose carriers 419 can have any suitable configuration for housing and/or supporting cables and/or hoses. The cable and hose carriers can be unsegment without mechanical hinges or segmented with mechanical hinges, in some embodiments. Cable and hose carriers 419 can be a source of contaminant particles. As second structure 410 moves to position patterning device 402, so too do cable and hose carriers 419. Movement of cable and hose carriers 419 may generate contamination particles that may travel from second chamber 406 to first chamber 404 via gap 414.

In some embodiments, gap 414 can be configured to function as a seal that eliminates or reduces the amount of contamination particles reaching patterning device 402 and/or regions near patterning device 402 in first chamber 404 from second chamber 406. For example, gap 414 can have a height 416 (the distance between (a) a surface 418 of first structure 408 facing second structure 410 and (b) a surface 420 of second structure 410 facing first structure 408) of about 2.0 mm to account for actuator errors, design-for clearance, crash deformations, tilt induced sag, and manufacturing tolerances. In some embodiments, gap 414 can have a length 422 of which surface 418 of first structure 408 is adjacent surface 420 of second structure 410. For example, length 422 of gap 414 can be about 50-350 mm. For example, length 422 of gap 414 can be about 70-320 mm. For example, length 422 of gap 414 can be about 75-315 mm. However, it is noted these are exemplary dimensions and the embodiments of this disclosure are not limited to these examples. Contamination particles moving through gap 414 bounce between surfaces 418 and 422. This bouncing causes the particles to lose energy and velocity, which allows the particles to either stick to surfaces 418 and 422, or slow to a magnitude that allows the gas flowing from through gap 414 towards chamber 406 (e.g., due to pressure differences in chambers 404 and 406) to push the particles toward chamber 406. Accordingly, gap 414 functions as a seal that eliminates or reduces the amount of contamination particles from second chamber 406 that reach patterning device 402 and/or regions near patterning device 402 in first chamber 404.

In some embodiments, length 422 (which can correspond to the length of surface 420) plus the range of motion of second structure 410 in the scan direction (e.g., along the Y-axis in FIG. 4) is less than a length 423 of surface 418. As such, the seal formed by gap 414 is maintained during normal motion of second structure 410 in the scan direction movement.

In some embodiments, surface 420 of second structure 410 can be extended and/or projected inward (e.g., toward second chamber 406) or outward (e.g., away from second chamber 406) from second structure 410.

The seal can extend entirely or partially around the periphery of second chamber 406 in some embodiments. The seal can have similar or different lengths along the scan direction (e.g., the Y axis) and along the direction transverse to the scan direction (e.g., the X-axis). In a non-limiting example, the seal can be longer along the scan direction (e.g., the Y axis) than along the direction transverse to the scan direction (e.g., the X-axis).

In some embodiments, first structure 408 and second structure 410 are each made of metal, for example, stainless steel, nickel coated aluminum, or any other suitable metal. In some embodiments, first structure 408 and second structure 410 are each made of plastic or any other suitable material. First structure 408 and second structure 410 can include same or different materials.

In some embodiments, patterning device 402 is mounted to second structure 410 such that second structure 410 can move patterning device 402 within first chamber 404. According to some embodiments, second structure 410 can move patterning device 402 in a scan direction (e.g., along the Y-axis in FIG. 4) and in a direction transverse to the scan direction (e.g., the X-axis in FIG. 4).

In some embodiments, second structure 410 includes a first part 424 and a second part 426 moveable relative to first part 424. Patterning device 402 can be mounted to second part 426 in some embodiments. In some embodiments, second part 426 can be a chuck configured to support and move patterning device 402.

According to some embodiments, second part 426 can be a short stroke module (fine positioning) of reticle stage 400 that supports patterning device 402. Second part 426 can be coupled to first part 424 such that second part 426 can move relative to first part 424, but also driven by first part 424. In a non-limiting example, second part 426 is coupled to the first part 424 by one or more actuators (not shown), such as motors, configured to move second part 426 relative to first part 424. In some embodiments, second part 426 can move in the scan direction (e.g., the Y-axis in FIG. 4) and in the direction transverse to the scan direction (e.g., the X-axis in FIG. 4). According to some embodiments, first part 424 can be a long stroke module (coarse positioning) of reticle stage 400 configured to move relative to first structure 408, thereby moving both second part 426 and patterning device 402.

In some embodiments, first part 424 can move in the scan direction (e.g., the Y-axis in FIG. 4) and in the direction transverse to the scan direction (e.g., the X-axis in FIG. 4). According to some examples, second part 426 can move with respect to first part 424 over a small range of movements relative to the range of movement of first part 424 relative to first structure 408. Short stroke and long stroke modules are merely examples of parts 424 and 426, respectively, and other structures can be used as parts 424 and 426. Further, the movement of parts 424 and 426 discussed above are exemplary movements, and the embodiments of this disclosure can include other directions and movement ranges.

Again, second chamber 406 can be defined, at least in part, by stationary first structure 408 and movable second structure 410. As shown in FIG. 4, stationary first structure 408 can also define an opening 428 through which one or more cable and hose carriers 419 pass. According to some examples, a pump 430 configured to create negative pressure, such as a suction pump, a vacuum pump, etc., can be operationally coupled to second chamber 406 (for example, at an upper portion of first structure 408) to create the vacuum pressure in second chamber 406 and first chamber 404. The flow created by pump 430 may also pull particles from second chamber 406. In some examples, pump 430 can be can be located outside housing 412 and is operationally coupled to second chamber 406 via a conduit 432. Additionally or alternatively, pump 430 can be inside housing 412 and is operationally coupled to second chamber 406 According to some examples, cable and hose carriers 419 can include one or more hoses coupled to pump 430.

Although pump 430 is illustrated on a side of housing 412 away from opening 428, pump 430 can be positioned at other locations, for example, near opening 428 and/or near the source of particle contamination, in some embodiments. In some embodiments in which pump 430 is positioned near opening 428 and/or near the source of particle contamination, the velocity of gas flow away from chamber 404 is maximized.

Figure 5:
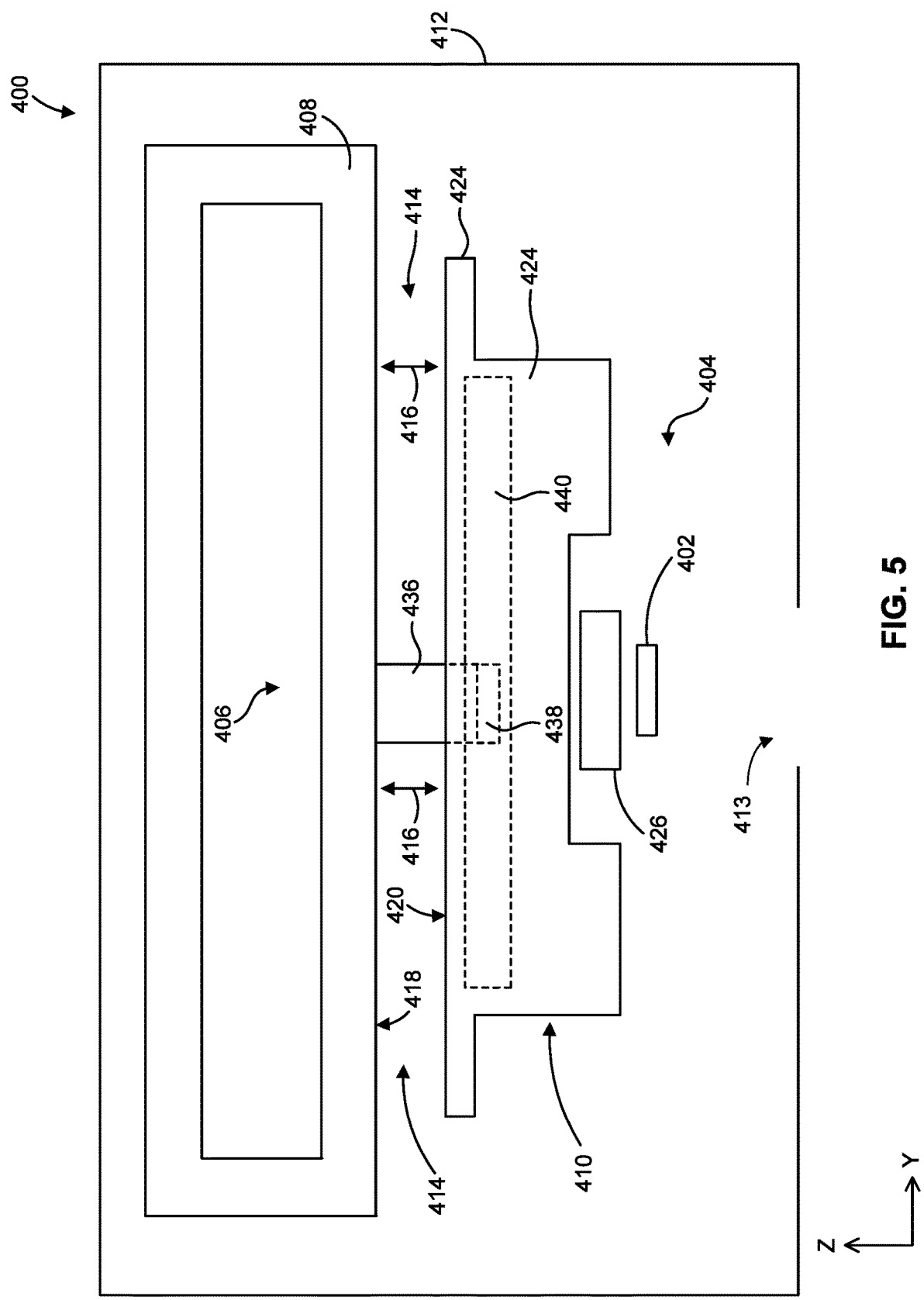
FIG. 5 schematically depicts another cross-section of the object stage of FIG. 4, according to an embodiment.

FIG. 5 schematically depicts another cross-section of reticle stage 400, according to an embodiment, with various components omitted for illustrative purposes. As shown in FIG. 5, reticle stage 400 can also include one or more stops 436 configured to constrain movement of second structure 410 relative to first structure 408, for example, along the Z-axis. Although only one stop 436 is illustrated in FIG. 5, reticle stage 400 can include more than one stop 436. For example, reticle stage 400 can include at least one stop 436 on each side of reticle stage 400. In some embodiments, stop 436 is fixedly coupled to first structure 408, and extends downward towards second structure 410. A distal end of stop 436 can include a flange 438 extending in a direction parallel to the x-axis. Flange 438 is configured to be slidably received within a channel 440 defined by second structure 410. As shown in FIG. 5, the major axis of channel 440 extends along the scanning direction (e.g., the Y-axis). Due to manufacturing tolerances and various design requirements, the dimensions of channel 440 are greater than the dimensions of flange 438. These dimensional differences between channel 440 and flange 438 allow second structure 410 to move relative to first structure 408 and to stop 436 in directions other than just the scan direction (e.g., the Y-axis) and the direction transverse to the scan direction (e.g., the X-axis). For example, relative to first structure 408, second structure 410 can translate in a direction parallel to the Z-axis, rotate about the X-axis, and rotate about the Y-axis until flange 438 contacts a surface of second structure 410 defining channel 440, which constrains further movement of second structure 410. Such movement in directions other than the scan direction and the direction transverse to the scan direction can occur during a crash event, for example, when there is a power supply failure to the actuators that move first part 424 of second structure 410 relative to first structure 408.

Figure 6:
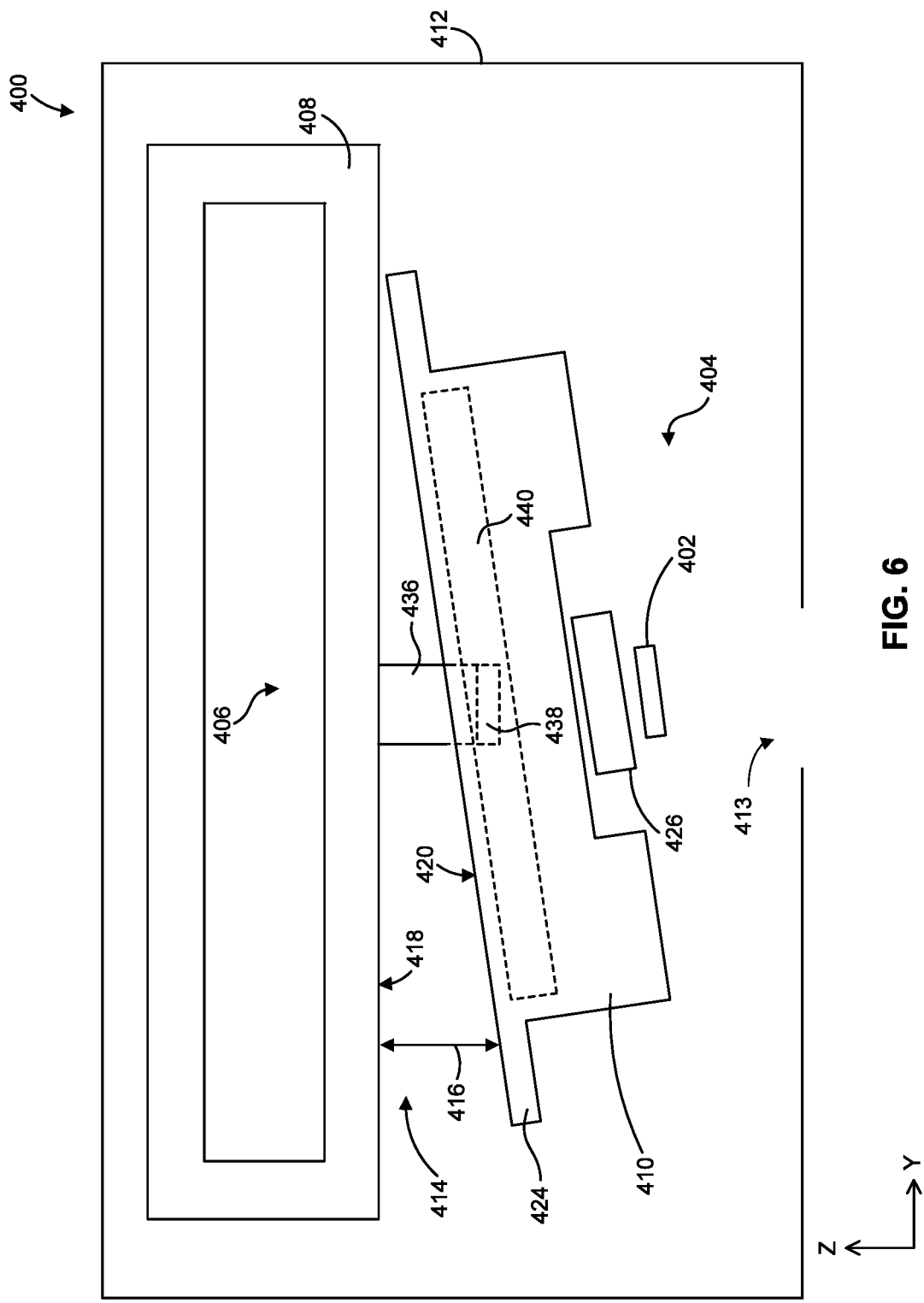
FIG. 6 schematically depicts another cross-section of the object stage of FIGS. 4 and 5, according to an embodiment.

As shown in FIG. 6, during a crash event, second structure 410 can rotate about the X-axis until flange 438 contacts a channel-defining surface of second structure 410. Due to this rotation, height 416 of gap 414 (as shown in FIG. 6) on one side of reticle stage 400 increases relative to height 416 of gap 414 when second structure 410 is substantially level relative to first structure 408 (as shown in FIG. 5). For example, when rotated about the X-axis (or the Y-axis) during a crash event, height 416 of gap 414 can exceed, for example, 2.0 mm. This increase in height 416 of gap 414 can allow more contaminant particles to pass through gap 414 since the amount of particles that can pass through gap 414 is linearly proportional to height 416.

Exemplary Object Stages Having Seal Plates

Figure 7:
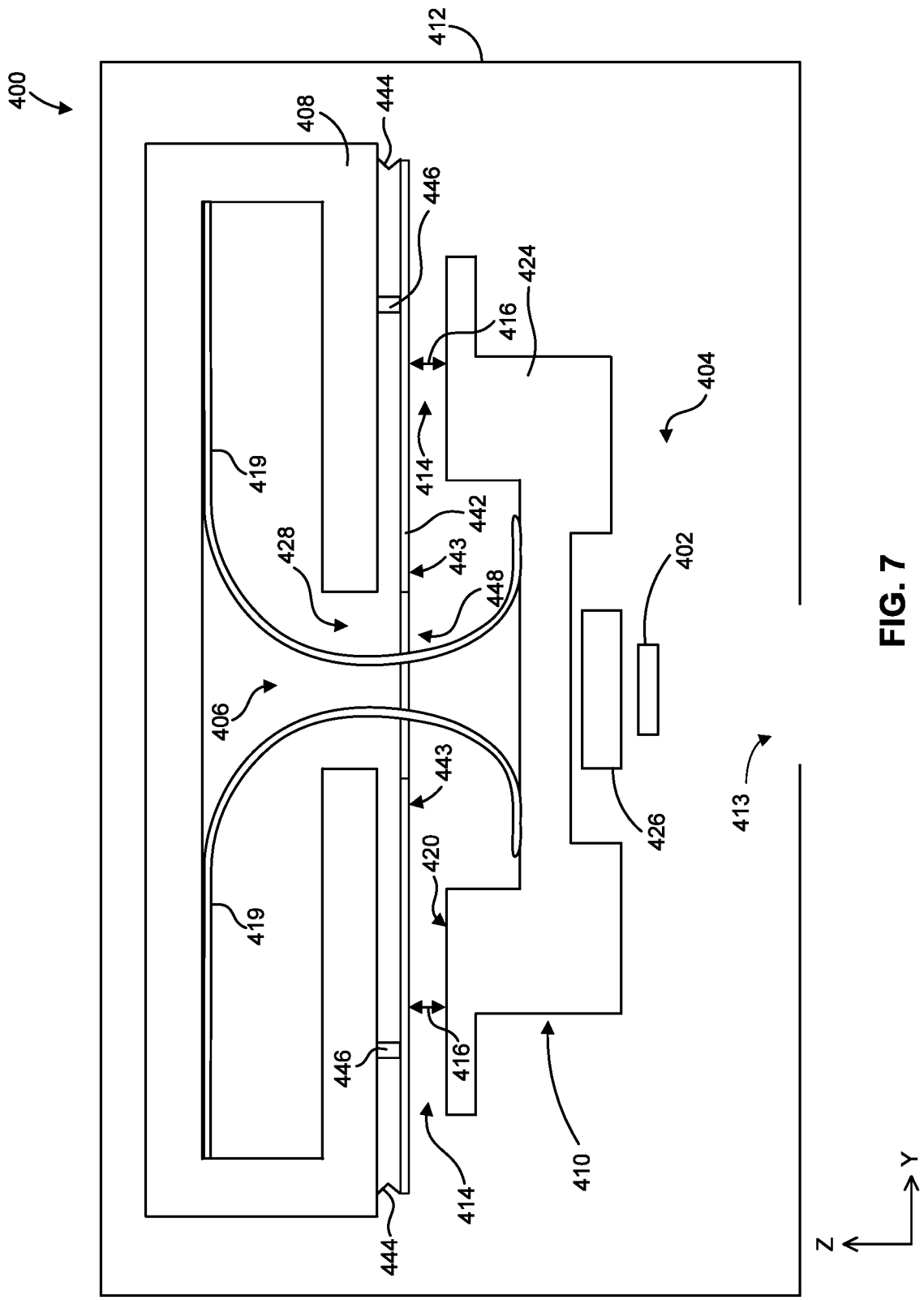
FIG. 7 schematically depicts a cross-section of an object stage, according to an embodiment. The vacuum pump(s) are omitted for illustrative purposes.

Referring collectively to the embodiments of FIGS. 7-12, reticle stage 400 can also include a seal plate 442 configured to move such that gap 414 extending between first chamber 404 and second chamber 406 remains substantially constant (i.e., the dimensions of gap 414, such as gap height 416, remain substantially constant) regardless of the position of second structure 410 relative to first structure 408, in some embodiments. Seal plate 442 can be movably coupled to either first structure 408 or second structure 410. In some embodiments, seal plate 442 can include a surface 443 facing the one of first structure 408 or second structure 410 to which seal plate 442 is not movably coupled. Surface 443 can define gap 414 along with respective surface 418 of first structure 408 or surface 420 of second structure 410 that is not coupled to seal plate 442, in some embodiments. Accordingly, seal plate 442 (and surface 443) can move as second structure 410 moves relative to first structure 408 such that gap 414 extending between first chamber 404 and second chamber 406 remains substantially constant. For example, referencing FIG. 8, as second structure 410 rotates, for example, about the X-axis, seal plate 442 rotates about the X-axis so that gap 414 remains substantially constant— gap height 416 of gap 414 remains substantially constant. For example, gap height 416 as shown in FIG. 7 is substantially equal to gap height 416 in FIG. 8 despite the change in orientation of second structure 410 relative to first structure 408.

In some embodiments, gap height 416 of gap 414 of an reticle stage 400 having seal plate 442 can be reduced relative to gap height 416 of gap 414 of reticle stage 400 without seal plate 442 (as shown in FIGS. 4-6). For example, in some embodiments, gap height 416 of reticle stage 400 having seal plate 442 is in a range from about 50 µm to about 500 µm, for example, about 200 µm. In contrast, for example, gap height 416 of reticle stage 400 without seal plate 442 is typically about 2000 μm. This reduction in gap height 416 helps further suppress the amount of contaminant particles that can travel through gap 414 from second chamber 406 to first chamber 404, as the amount of particles that can pass through gap 414 as a function of gap geometry is linearly proportional to height 416. In other embodiments, gap height 416 of gap 414 of reticle stage 400 having seal plate 442 can be outside the range from about 50 μm to about 500 μm.

In some embodiments, seal plate 442 can be made of stainless steel, nickel coated aluminum, any other suitable metal, or any other combination thereof. For example, seal plate 442 can include a stainless steel foil supported by a nickel coated aluminum frame surrounding the periphery of the stainless steel foil. In some embodiments, the mass of seal plate 442 is substantially lower than the mass of second structure 410, thereby providing better control of seal plate 442 relative to second structure 410 at the same control frequency bandwidth. For example, in some embodiments, the mass of seal plate 442 is less than about 10 kg, and the mass of second structure 410 is about 100 kg.

In some embodiments, one or more controllers are operative coupled (wirelessly or by wired connections) to one or more sensors that monitor the position of second structure 410 (for example, position sensors IF1 or IF2 described above with reference to FIG. 1A) relative to first structure 408, and to one or more actuators 446. Based on the signals received from the one or more position sensors, the one or more controllers can adjust the control signal(s) transmitted to the one or more actuators 446—the controllers can control actuation actuator 446 based on a determined position of the second structure.

In some embodiments, the transmitted control signal(s) can be a function of the measured position of second structure 410, and the control signal(s) can indicate a desired parameter of actuators 446 (for example, a length, position, shape, or force magnitude) that moves seal plate 442 such that gap 414 remains substantially constant.

In some embodiments, seal plate 442 defines an opening 448 to allow components to pass, for example, cable slaps 419, from first structure 408 to second structure 410. Opening 448 can be aligned, along the Z-axis, with opening 428 defined by first structure 408.

Figure 8:
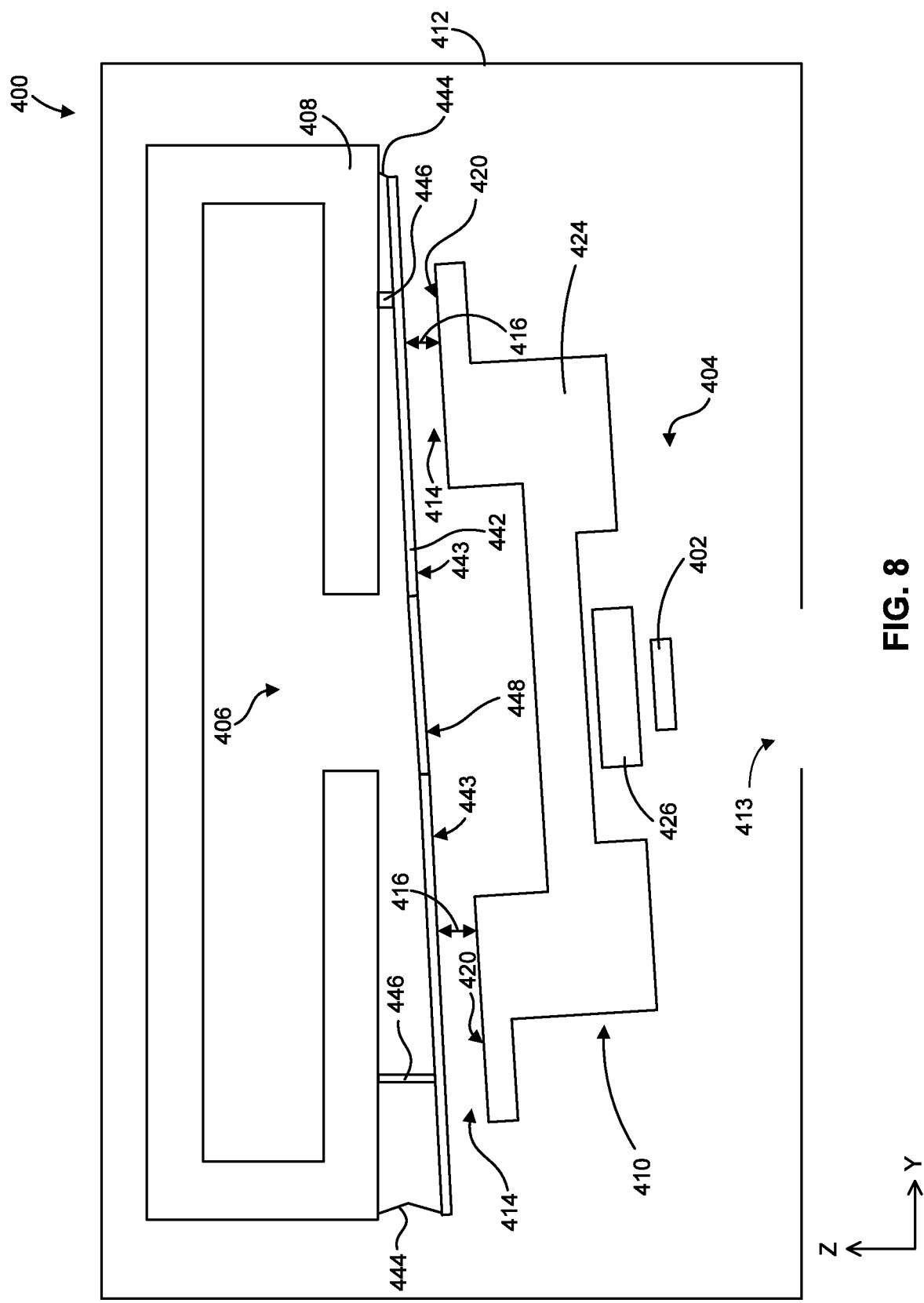
FIG. 8 schematically depicts another cross-section of the object stage of FIG. 7, according to an embodiment. The vacuum pump(s) and cable and hose carriers are omitted for illustrative purposes.

FIGS. 7 and 8 illustrate one embodiment of reticle stage 400 having seal plate 442. As shown in FIG. 7, seal plate 442 is movably coupled to first structure 408 in some embodiments. In some embodiments, seal plate 442 can move in one or more of the following degrees of freedom: translation along the Z-axis, rotation about the X-axis, and rotation about the Y-axis. Seal plate 442 includes a surface 443 facing second structure 410, thereby defining gap 414 along with surface 420 of second structure 410.

In some embodiments, seal plate 442 is longer than first part 424 of second structure 410 in the scan direction (e.g., along the Y-axis in FIG. 7) to account for moment of second structure 410 during ordinary scanning operation. Accordingly, gap 414 is formed between surface 443 and surface 418 regardless of the relative position between first structure 410 and seal plate 442 during ordinary scanning operation.

In some embodiments, reticle stage 400 includes a flexible wall 444 that extends between seal plate 442 (for example, around the perimeter of seal plate 442 as shown in FIG. 7) and first structure 408 to create a flexible hermetic seal. Flexible wall 444 can be a bellows in some embodiments. When viewed in plan, flexible wall 444 can extend completely around (e.g., entirely around the perimeter of) seal plate 442 in some embodiments. In other embodiments, flexible wall 444 extends around a portion of seal plate 442. Flexible wall 444 can be flexible in one or more of the following degrees of freedom: along the Z-axis, about the X-axis, and about the Y-axis. Such flexibility allows corresponding movement of seal plate 442 relative to first structure 408.

Reticle stage 400 can include one or more actuators 446 configured to move seal plate 442. In some embodiments, reticle stage 400 includes a plurality of actuators 446 each coupled to first structure 408 on one end and to seal plate 442 on the other end. Actuators 446 can be, for example, piezoelectric actuators, Lorentz actuators, magnetic actuators, shape-memory alloy actuators, or any other suitable actuator. In some embodiments, actuators 446 are configured to move seal plate 442 along one or more of the following degrees of freedom: translation along the Z-axis, rotation about the X-axis, and rotation about the Y-axis.

Referencing FIG. 8 for example, one or more controllers can detect (via the one or more position sensors) rotation of second structure 410 counter-clockwise about the X-axis and transmit control signals to actuators 446 to move seal plate 442 such that seal plate 442 likewise rotates counter-clockwise relative to first structure 408 about the X-axis, thereby keeping gap 414 substantially constant. For example, gap height 416 before second structure 410 rotates about the X-axis (e.g., FIG. 7) is substantially equal to gap height 416 after rotation (e.g., FIG. 8). To achieve such rotation, for example, actuators 446 on the left side of FIG. 8 can increase in length while actuators 446 on the right side of FIG. 8 can decrease in length, thereby rotating seal plate 442 relative to first structure 408 about the X-axis. Despite rotation of second structure 410 relative first structure 408, there is substantially no relative rotation between surface 443 of seal plate 442 and surface 420 of second structure 410.

Although actuators 446 are coupled to first structure 408 in the embodiment of FIGS. 7 and 8, actuators 446 can be disposed on second structure 410 in some embodiments (not shown). For example, actuators 446 could be Lorentz force actuators or piezoelectric actuators disposed on second structure 410 that are configured to move seal plate 442 that is coupled to first structure 408.

Figure 9:
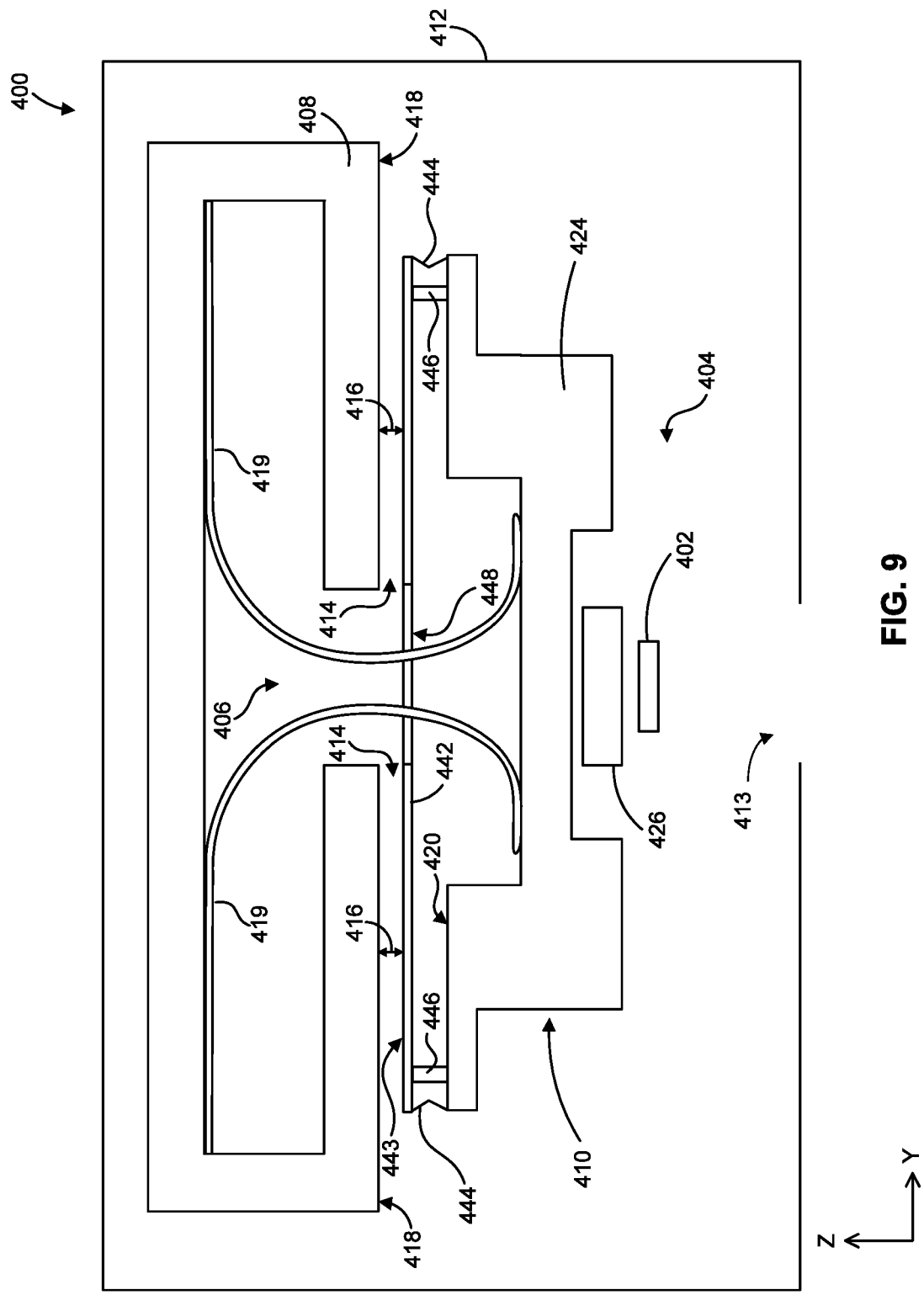
FIG. 9 schematically depicts a cross-section of an object stage, according to an embodiment. The vacuum pump(s) are omitted for illustrative purposes.
Figure 10:
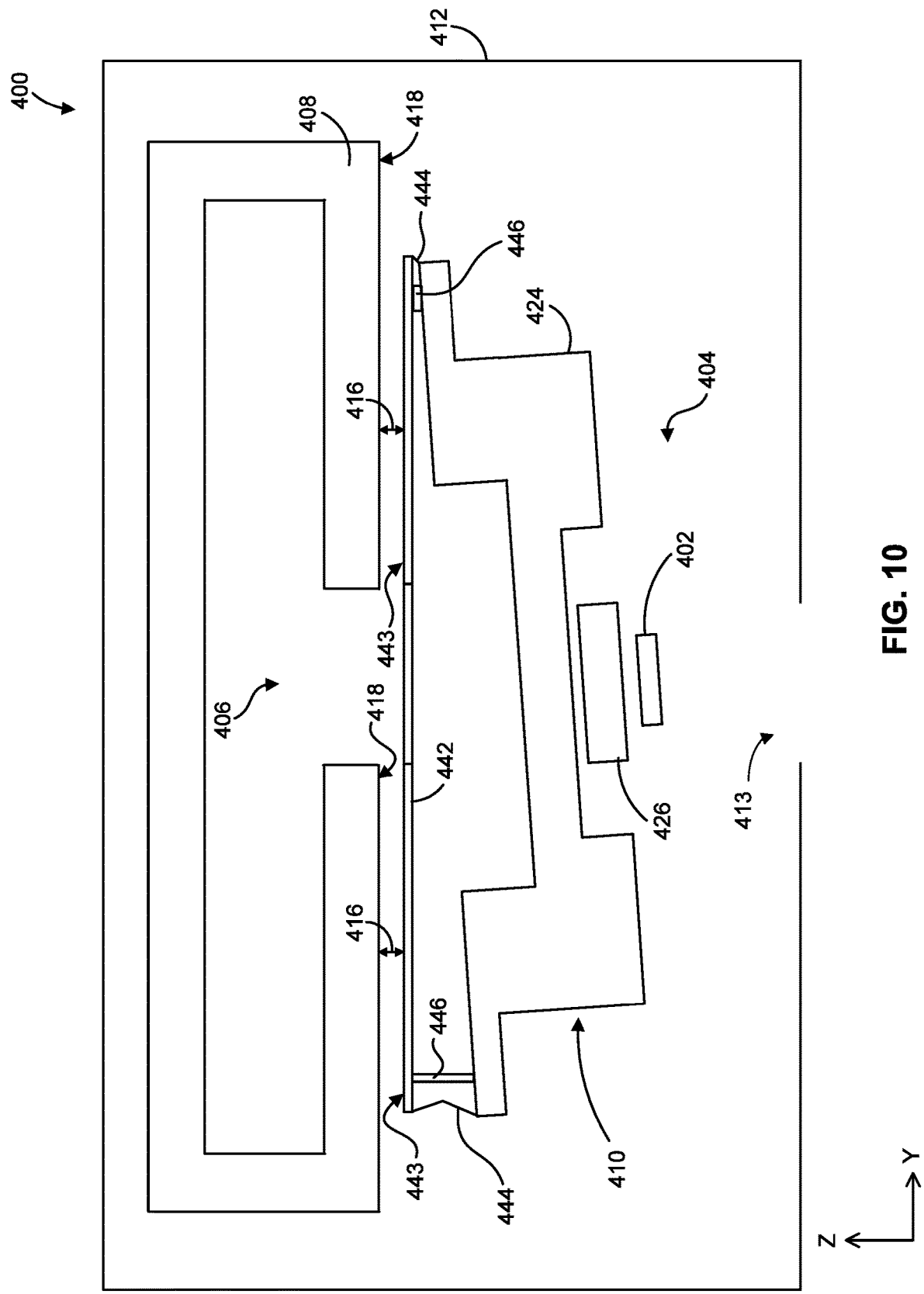
FIG. 10 schematically depicts another cross-section of the object stage of FIG. 9, according to an embodiment. The vacuum pump(s) and cable and hose carriers are omitted for illustrative purposes.

FIGS. 9 and 10 illustrate another embodiment of reticle stage 400 having seal plate 442. As shown in FIGS. 9 and 10, seal plate 442 is movably coupled to movable second structure 410 in some embodiments. In some embodiments, seal plate 442 can move in one or more of the following degrees of freedom: translation along the Z-axis, rotation about the X-axis, and rotation about the Y-axis. Surface 443 of seal plate 442 faces first structure 408, thereby defining gap 414 along with surface 418 of first structure 408.

As shown in FIGS. 9 and 10, flexible wall 444 extends between seal plate 442 (for example, around the perimeter of seal plate 442 as shown in FIGS. 9 and 10) and second structure 410 to create a flexible hermetic seal. When viewed in plan, flexible wall 444 can extend completely around (e.g., entirely around the perimeter of) seal plate 442 in some embodiments. In other embodiments, flexible wall 444 extends around a portion of seal plate 442. Flexible wall 444 can be flexible in one or more of the following degrees of freedom: along the Z-axis, about the X-axis, and about the Y-axis. Such flexibility allows corresponding movement of seal plate 442 relative to first structure 408.

As shown in FIGS. 9 and 10, reticle stage 400 can include a plurality of actuators 446 each coupled to second structure 410 on one end and to seal plate 442 on the other end. In some embodiments, actuators 446 are configured to move seal plate 442 along one or more of the following degrees of freedom: translation along the Z-axis, rotation about the X-axis, and rotation about the Y-axis. Although actuators 446 are coupled to second structure 410 in the embodiment of FIGS. 9 and 10, actuators 446 can be disposed on first structure 408 in some embodiments (not shown).

Referencing FIG. 10 for example, one or more controllers can detect (via the one or more position sensors) movement such as rotation of second structure 410 counter-clockwise about the X-axis and transmit control signals to actuators 446 to move seal plate 442 such that seal plate 442 rotates clockwise relative to second structure 410 about the X-axis (opposite the rotation of second structure 410), thereby keeping gap 414 substantially constant. For example, gap height 416 before second structure 410 rotates about the X-axis (e.g., FIG. 9) is substantially equal to gap height 416 after rotation about the X-axis (e.g., FIG. 10). To achieve such rotation, for example, actuators 446 on the left side of FIG. 10 increase in length while actuators 446 on the right side of FIG. 10 decrease in length, thereby rotating seal plate 442 relative to second structure 410 about the X-axis. Despite rotation of second structure 410 relative to first structure 408, there is substantially no relative rotation between surface 443 of seal plate 442 and surface 418 of first structure 408.

Figure 11:
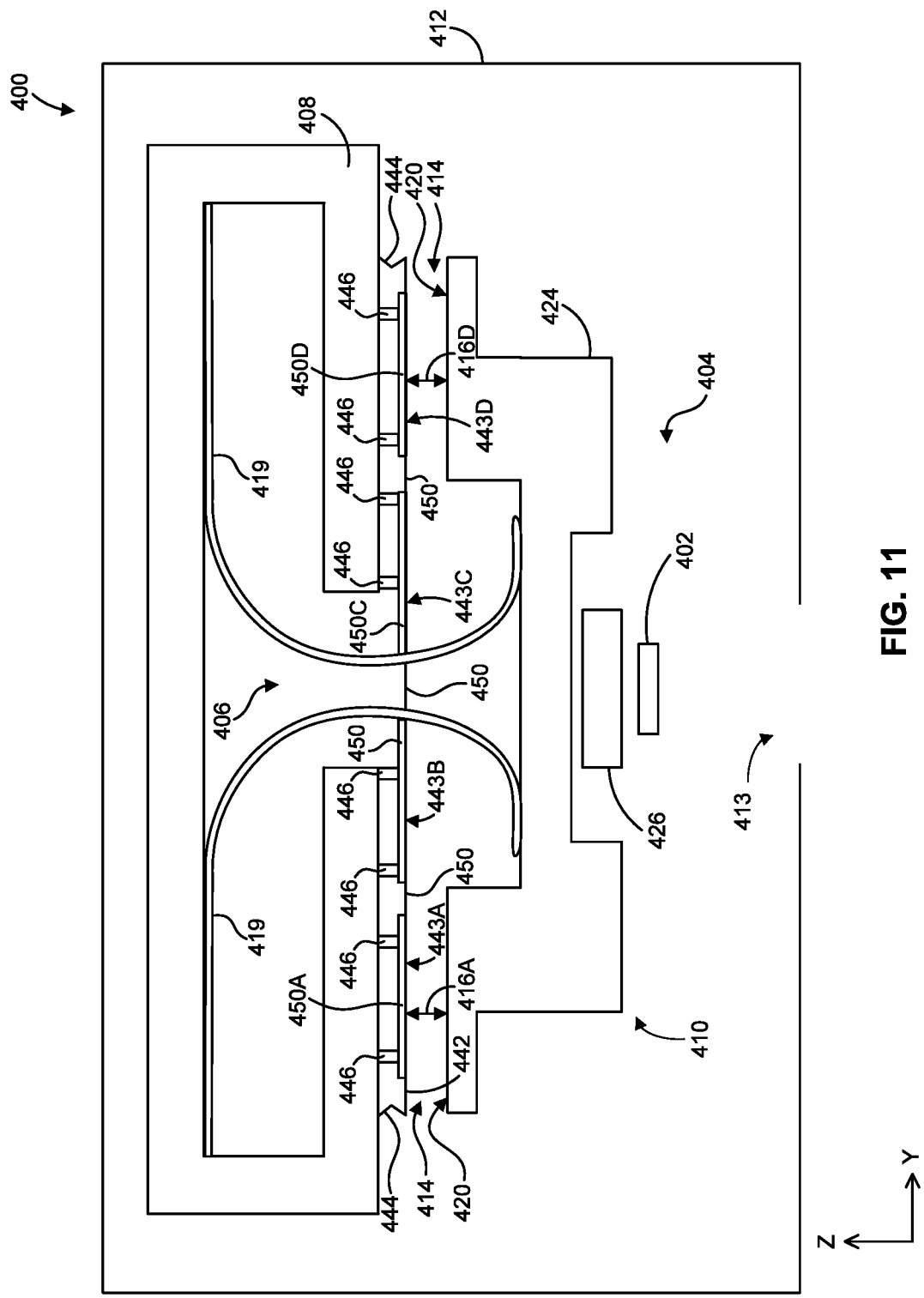
FIG. 11 schematically depicts a cross-section of an object stage, according to an embodiment. The vacuum pump(s) are omitted for illustrative purposes.
Figure 12:
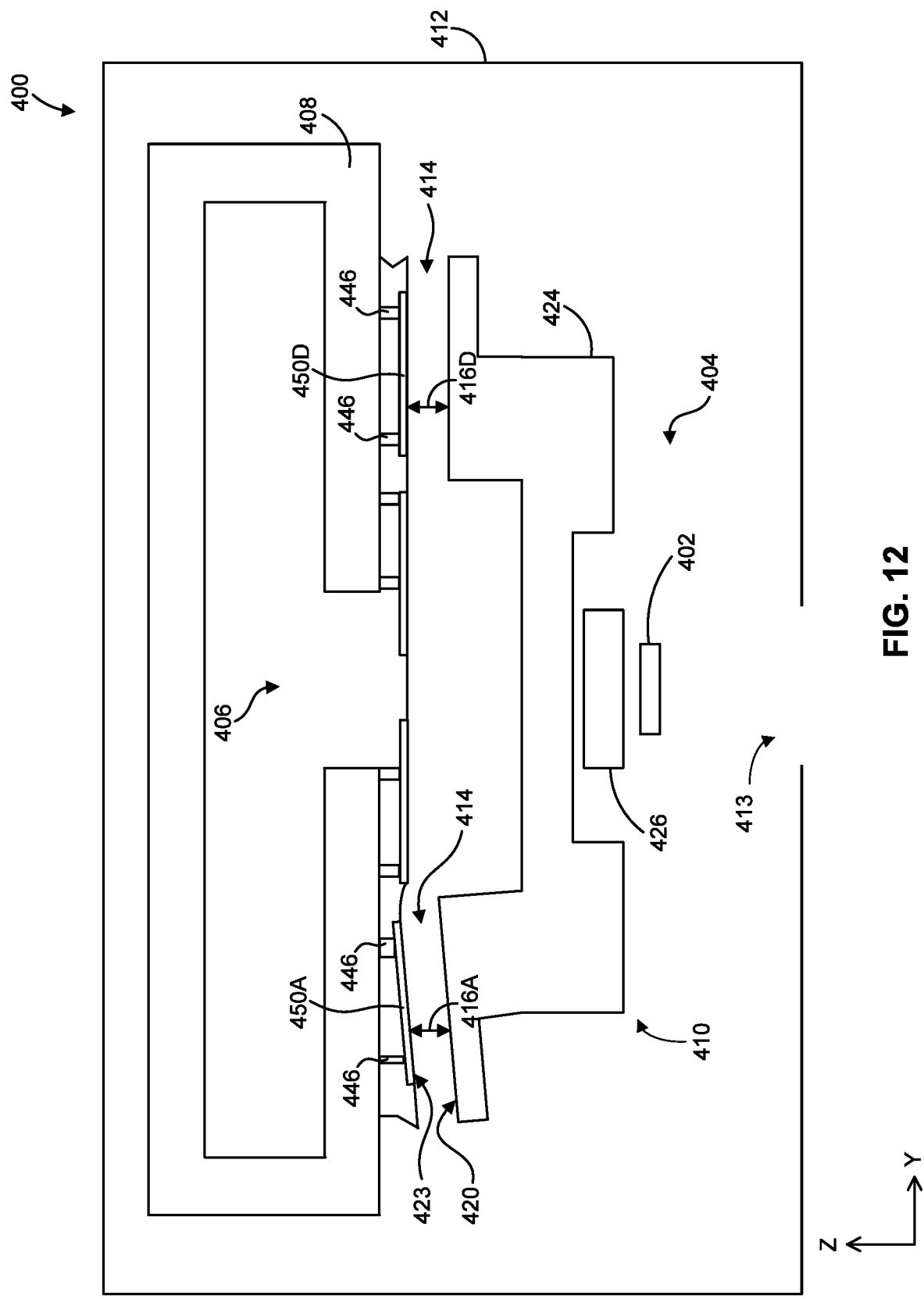
FIG. 12 schematically depicts another cross-section of the object stage of FIG. 11, according to an embodiment. The vacuum pump(s) and cable and hose carriers are omitted for illustrative purposes.

In some embodiments, seal plate 442 can be segmented. FIGS. 11 and 12 illustrate one such embodiment. As shown in FIGS. 11 and 12, seal plate 442 can include a plurality of segments 450A, 450B, 450C, and 450D, and flexible joints 452 connecting adjacent segments 450A, 450B, 450C, and 450D. Joints 452 allow each segment of segments 450A, 450B, 450C, and 450D to move substantially independent of adjacent segments in one or more of the following degrees of freedom: translation along the Z-axis, rotation about the X-axis, and rotation about the Y-axis. As shown FIG. 12 for example, segment 450A can independent rotate about the X-axis while the other segments 450B, 450C, and 450D remain substantially stationary.

Reticle stage 400 includes one or more actuators 446 for each segment 450A, 450B, 450C, and 450D that are configured to move respective segments 450A, 450B, 450C, and 450D in one or more of the following degrees of freedom: translation along the Z-axis, rotation about the X-axis, and rotation about the Y-axis. As shown in FIGS. 11 and 12 for example, reticle stage 400 can include a plurality of actuators 446 configured to move a respective segment 450A, 450B, 450C, and 450D. As shown in FIGS. 11 and 12, actuators 446 are coupled to first structure 408 on one end and to respective segments 450A, 450B, 450C, and 450D on the other end.

In some embodiments, one or more controllers can detect (via the one or more position sensors) movement of second structure 410 relative to first structure 408, for example, during a crash event, and transmit control signals to actuators 446 to independently or collectively move segments 450A, 450B, 450C, and 450D such that each segment 450A, 450B, 450C, and 450D moves in a manner that keeps gap 414 substantially constant. For example, gap heights 416A and 416D (the distances between surface 420 of second structure 410 and respective surfaces 443A and 443D of segments 450A and 450D) before second structure 410 moves relative to first structure 408 is substantially equal to gap heights 416A and 416D after such movement.

Referencing FIG. 12 for example, the one or more controllers can detect (via the one or more position sensors) local deformation of second structure 410 (for example, local rotation of the left side of second structure 410 in FIG. 12 counter-clockwise about the X-axis) during a crash event, and transmit control signals to actuators 446 configured to move segment 450A, which is adjacent the local deformation of second structure 410, to move segment 450A such that segment 450A likewise rotates counter-clockwise relative to first structure 408 about the X-axis, thereby keeping gap 414 substantially constant. For example, gap height 416A before second structure 410 locally rotates about the X-axis (e.g., FIG. 11) is substantially equal to gap height 416A after rotation about the X-axis (e.g., FIG. 12). To achieve such rotation, for example, actuators 446 on the left side of segment 450A in FIG. 12 can increase in length while actuators 446 on the right side of segment 450A can decrease in length, thereby rotating segment 450A relative to first structure 408 about the X-axis. Despite local rotation of second structure 410 relative first structure 408, there is substantially no relative rotation between surface 443A of segment 450A and surface 420 of second structure 410.

Segmented seal plate 442 can reduce the magnitude of force actuators 446 necessary to move seal plate 442, and can increase the frequency bandwidth at which seal plate 442 can be accurately controlled.

Although FIGS. 11 and 12 illustrate segmented seal plate 442 being movably coupled to first structure 408, segmented seal plate 442 can be movably coupled to second structure 410 similar to seal plate 442 in the embodiment of FIGS. 9 and 10.

The embodiments may further be described using the following clauses:

1. An object stage comprising:
    a first structure;
    a second structure movable relative to the first structure and configured to support an object;
    a seal plate movably coupled to the first structure or the second structure, but not both; and
    at least one actuator configured to move the seal plate such that a substantially constant gap is defined between the seal plate and the first structure or the second structure that is not coupled to the seal plate.
2. The object stage of clause 1, wherein:
    the first structure and the second structure define a first chamber;
    the object is positioned within a second chamber; and
    the gap extends between the first chamber and the second chamber.
3. The object stage of clause 2, wherein the first chamber and the second chamber are each at a vacuum pressure.
4. The object stage of clause 1, wherein the seal plate is movably coupled to the first structure.
5. The object stage of clause 1, wherein the seal plate is movably coupled to the second structure.
6. The object stage of clause 1, further comprising a flexible wall forming a hermetic seal between (a) the seal plate and (b) the first structure or the second structure that is coupled to the seal plate.
7. The object stage of clause 1, wherein the at least one actuator comprises at least one of a piezoelectric actuator, a Lorentz actuator, a magnetic actuator, and a shape-memory alloy actuator.
8. The object stage of clause 1, wherein:
    the second structure is a reticle chuck; and
    the object is a reticle.
9. The object stage of clause 1, further comprising:
    at least one sensor configured to determine the position of the second structure; and a controller operatively coupled to the at least one sensor and the at least one actuator, and configured to control actuation of the at least one actuator based on a determined position of the second structure.

10. The object stage of clause 1, wherein:
   the seal plate comprises a plurality of segments and a plurality of flexible joints each coupling respective adjacent segments; and
   the at least one actuator comprises a plurality of actuators each coupled to a respective segment of the plurality of segments.

11. A lithographic apparatus configured to transfer a pattern from a patterning device onto a substrate, the lithographic apparatus comprising:
   a substrate table configured to hold and move the substrate along a scanning direction; and
   a reticle stage configured to hold and move the reticle along the scanning direction, the reticle stage comprising:
      a first structure;
      a chuck movable relative to the first structure and configured to support the reticle;
      a seal plate movably coupled to the first structure or the chuck, but not both; and
      at least one actuator configured to move the seal plate such that a substantially constant gap is defined between the seal plate and the first structure or the chuck that is not coupled to the seal plate.

12. The lithographic apparatus of clause 11, wherein:
   the first structure and the chuck define a first chamber;
   the reticle is positioned within a second chamber; and
   the gap extends between the first chamber and the second chamber.

13. The lithographic apparatus of clause 112, wherein the first chamber and the second chamber are each at a vacuum pressure.

14. The lithographic apparatus of clause 11, wherein the seal plate is movably coupled to the first structure.

15. The lithographic apparatus of clause 11, wherein the seal plate is movably coupled to the chuck.

16. The lithographic apparatus of clause 11, further comprising a flexible wall forming a hermetic seal between (a) the seal plate and (b) the first structure or the chuck that is coupled to the seal plate.

17. The lithographic apparatus of clause 11, wherein the at least one actuator comprises at least one of a piezoelectric actuator, a Lorentz actuator, a magnetic actuator, and a shape-memory alloy actuator.

18. The lithographic apparatus of clause 11, wherein each of the seal plate and the chuck are configured to rotate about an axis perpendicular to the scanning direction.

19. The lithographic apparatus of clause 11, further comprising:
   at least one sensor configured to determine the position of the chuck; and
   a controller operatively coupled to the at least one sensor and the at least one actuator, and configured to control actuation of the at least one actuator based on a determined position of the chuck.

20. The lithographic apparatus of clause 11, wherein:
   the seal plate comprises a plurality of segments and a plurality of flexible joints each coupling respective adjacent segments; and
   the at least one actuator comprises a plurality of actuators each coupled to a respective segment of the plurality of segments.

The embodiments of this disclosure can be used for particle suppression in, for example, a reticle stage. The embodiments this disclosure can also be used for particle suppression in other suitable components of a lithography apparatus, other particle sensitive apparatus such as metrology systems, tubes, gas flow ducts, or boxes of gas ducts/pipes, and/or any particle sensitive apparatus to reduce the number of undesired contaminant particles.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the disclosure in the context of optical lithography, it will be appreciated that the disclosure may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

Further, the terms "radiation" and "beam" used herein encompass all types of electromagnetic radiation, including ultraviolet (UV) radiation (for example, having a wavelength λ of 365, 248, 193, 157 or 126 nm), extreme ultraviolet (EUV or soft X-ray) radiation (for example, having a wavelength in the range of 5-20 nm such as, for example, 13.5 nm), or hard X-ray working at less than 5 nm, as well as particle beams, such as ion beams or electron beams. Generally, radiation having wavelengths between about 400 to about 700 nm is considered visible radiation; radiation having wavelengths between about 780-3000 nm (or larger) is considered IR radiation. UV refers to radiation with wavelengths of approximately 100-400 nm. Within lithography, the term "UV" also applies to the wavelengths that can be produced by a mercury discharge lamp: G-line 436 nm; H-line 405 nm; and/or, I-line 365 nm. Vacuum UV, or VUV (i.e., UV absorbed by gas), refers to radiation having a wavelength of approximately 100-200 nm. Deep UV (DUV) generally refers to radiation having wavelengths ranging from 126 nm to 428 nm, and in an embodiment, an excimer laser can generate DUV radiation used within a lithographic apparatus. It should be appreciated that radiation having a wavelength in the range of, for example, 5-20 nm relates to radiation with a certain wavelength band, of which at least part is in the range of 5-20 nm.

The term "substrate" as used herein generally describes a material onto which subsequent material layers are added. In embodiments, the substrate itself may be patterned and materials added on top of it may also be patterned, or may remain without patterning.

It should be understood that relative spatial descriptions between one or more particular features, structures, or characteristics used herein are for purposes of illustration only, and that practical implementations of the structures described herein may include misalignment tolerances without departing from the spirit and scope of the present disclosure.

While specific embodiments of the disclosure have been described above, it will be appreciated that the disclosure may be practiced otherwise than as described. The description is not intended to limit the disclosure.

It is to be appreciated that the Detailed Description section, and not the Summary and Abstract sections, is intended to be used to interpret the claims. The Summary and Abstract sections may set forth one or more but not all exemplary embodiments of the present disclosure as contemplated by the inventor(s), and thus, are not intended to limit the present disclosure and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein.

The breadth and scope of the present disclosure should not be limited by any of the above-described exemplary embodiments, but should be defined only in accordance with the following claims and their equivalents.

What is claimed is:

1. An object stage comprising:
   a first structure;
   a second structure movable relative to the first structure and configured to support an object, wherein the second structure is configured to support the object at a first side of the second structure and the first structure is at a second side of the second structure opposite to the first side of the second structure;
   a seal plate movably coupled to the first structure or the second structure, but not both, such that the seal plate is movable with respect to the first structure or second structure to which it is coupled; and
   at least one actuator configured to rotate the seal plate with respect to, translate the seal plate away from, and/or translate the seal plate toward, the first structure or second structure to which it is coupled such that a substantially constant gap is defined between the seal plate and the first structure or second structure that is not coupled to the seal plate.

2. The object stage of claim 1, wherein the seal plate is movably coupled to the first structure.

3. The object stage of claim 1, wherein the seal plate is movably coupled to the second structure.

4. The object stage of claim 1, further comprising a flexible wall forming a hermetic seal between (a) the seal plate and (b) the first structure or second structure that is coupled to the seal plate.

5. The object stage of claim 1, wherein the at least one actuator comprises at least one selected from: a piezoelectric actuator, a Lorentz actuator, a magnetic actuator, and/or a shape-memory alloy actuator.

6. The object stage of claim 1, wherein:
   the second structure is a reticle chuck; and
   the object is a reticle.

7. The object stage of claim 1, further comprising:
   at least one sensor configured to determine a position of the second structure; and
   a controller operatively coupled to the at least one sensor and the at least one actuator, and configured to control actuation of the at least one actuator based on a determined position of the second structure.

8. The object stage of claim 1, wherein:
   the seal plate comprises a plurality of segments and a plurality of flexible joints each coupling respective adjacent segments; and
   the at least one actuator comprises a plurality of actuators each coupled to a respective segment of the plurality of segments.

9. A lithographic apparatus configured to transfer a pattern from a patterning device onto a substrate, the lithographic apparatus comprising:
   a substrate table configured to hold and move the substrate along a scanning direction; and
   a reticle stage configured to hold and move the patterning device along the scanning direction, the reticle stage comprising:
   a first structure;
   a chuck movable relative to the first structure and configured to support the patterning device, wherein the chuck is configured to support the patterning device at a first side of the chuck and the first structure is at a second side of the chuck opposite to the first side of the chuck;
   a seal plate movably coupled to the first structure or the chuck, but not both, such that the seal plate is movable with respect to the first structure or chuck to which it is coupled; and
   at least one actuator configured to rotate the seal plate with respect to, translate the seal plate away from, and/or translate the seal plate toward, the first structure or chuck to which it is coupled such that a substantially constant gap is defined between the seal plate and the first structure or chuck that is not coupled to the seal plate.

10. The lithographic apparatus of claim 9, wherein:
    the first structure and the chuck define a first chamber;
    the patterning device, when supported by the chuck, is positioned within a second chamber; and
    the gap extends between the first chamber and the second chamber.

11. The lithographic apparatus of claim 10, wherein the first chamber and the second chamber are each at a vacuum pressure.

12. The lithographic apparatus of claim 9, wherein the seal plate is movably coupled to the first structure.

13. The lithographic apparatus of claim 9, wherein the seal plate is movably coupled to the chuck.

14. The lithographic apparatus of claim 9, further comprising a flexible wall forming a hermetic seal between (a) the seal plate and (b) the first structure or chuck that is coupled to the seal plate.

15. The lithographic apparatus of claim 9, wherein the at least one actuator comprises at least one selected from: a piezoelectric actuator, a Lorentz actuator, a magnetic actuator, and/or a shape-memory alloy actuator.

16. The lithographic apparatus of claim 9, wherein each of the seal plate and the chuck are configured to rotate about an axis perpendicular to the scanning direction.

17. The lithographic apparatus of claim 9, further comprising:
   at least one sensor configured to determine a position of the chuck; and
   a controller operatively coupled to the at least one sensor and the at least one actuator, and configured to control actuation of the at least one actuator based on a determined position of the chuck.

18. The lithographic apparatus of claim 9, wherein:
   the seal plate comprises a plurality of segments and a plurality of flexible joints each coupling respective adjacent segments; and
   the at least one actuator comprises a plurality of actuators each coupled to a respective segment of the plurality of segments.

19. An object stage comprising:
   a first structure;
   a second structure movable relative to the first structure and configured to support an object, wherein the first structure and the second structure define a first chamber and the object, when supported by the second structure, is positioned within a second chamber;
   a seal plate movably coupled to the first structure or the second structure, but not both; and
   at least one actuator configured to move the seal plate such that a substantially constant gap is defined between the seal plate and the first structure or second structure that is not coupled to the seal plate, wherein the gap extends between the first chamber and the second chamber.

20. The object stage of claim 19, wherein the first chamber and the second chamber are each at a vacuum pressure.

21. A lithographic apparatus configured to transfer a pattern from a patterning device onto a substrate, the lithographic apparatus comprising:
   the object stage of claim 19, wherein the object stage is configured to hold and move the patterning device as the object along a scanning direction or wherein the object stage is configured to hold and move the substrate as the object along a scanning direction.

* * * * *